United States Patent [19]

Popek et al.

[11] Patent Number: 4,720,690
[45] Date of Patent: Jan. 19, 1988

[54] SCULPTURED STRIPLINE INTERFACE CONDUCTOR

[75] Inventors: Marc H. Popek, Indian Harbour Beach; Kenneth D. Springer, St. Petersburg; William R. Beaudet, Melbourne; Ralph D. DiStefano, Palm Bay, all of Fla.

[73] Assignee: Harris Corporation, Melbourne, Fla.

[21] Appl. No.: 885,557

[22] Filed: Jul. 14, 1986

[51] Int. Cl.[4] .............................................. H01P 5/12
[52] U.S. Cl. ........................................... 333/1; 29/600; 333/246; 361/406; 439/55
[58] Field of Search .................... 333/1, 238, 246, 247; 339/17 CF; 174/52 FP; 361/401, 406, 414; 29/600

[56] References Cited

U.S. PATENT DOCUMENTS

| | | | |
|---|---|---|---|
| 3,209,291 | 9/1965 | Schneider . | |
| 3,792,383 | 2/1974 | Knappenberger . | |
| 3,908,185 | 9/1975 | Martin | 357/74 |
| 3,958,195 | 5/1976 | Johnson . | |
| 4,085,390 | 4/1978 | Standing | 333/33 |
| 4,172,261 | 10/1979 | Tsuzuki et al. | 357/81 |
| 4,232,278 | 11/1980 | Gawronski et al. | 333/247 X |
| 4,259,684 | 3/1981 | Dean et al. | 357/74 |
| 4,301,429 | 11/1981 | Goldman et al. | 333/22 R |
| 4,513,355 | 4/1985 | Schroeder et al. | 339/17 CF X |
| 4,551,746 | 11/1985 | Gilbert et al. | 357/74 |
| 4,593,243 | 6/1986 | Leo et al. | 333/1 X |

OTHER PUBLICATIONS

Handbook of Tri-plate Microwave Components Wild, Butler, Sommers, Nelligan and Wilson.
Flook ECL User's Handbook, Fairchild, pp. 5-5 through 5-9 and 5-21.

Primary Examiner—Paul Gensler
Attorney, Agent, or Firm—John L. DeAngelis, Jr.

[57] ABSTRACT

A sculptured stripline interface conductor for providing spaced apart access to the closely spaced conductors of a circuit element. The low impedance and crosstalk of stripline suggests the use thereof in high-frequency applications. In the sculptured stripline interface conductor of the present invention the circuit traces of the buried signal layer are closely spaced in a first section of the stripline interface conductor and spaced further apart in a second section thereof. In the area where the circuit traces are closely spaced, different-shaped rectangular holes are made in the upper and lower ground plane conductors to expose the inner circuit traces. The upper ground plane conductor also has holes in the second section for exposing a pad in the circuit traces. External connection to each conductor of the circuit element is then made to the circuit trace pad through the holes in the upper ground plane conductor. The circuit element is disposed adjacent the rectangular holes and the leads thereof are connected to the inner circuit traces exposed by the rectangular holes.

9 Claims, 7 Drawing Figures

SCULPTURED STRIPLINE INTERFACE CONDUCTOR

This invention was made with Government support under Contract No. 84-C-6015. The Government has certain rights in this invention.

FIELD OF THE INVENTION

This invention relates to an apparatus, and a method for making the apparatus, for providing a stripline circuit having spaced-apart terminals so that a circuit element having closely spaced leads can be connected via stripline to other devices or to connectors.

BACKGROUND OF THE INVENTION

Microstrip and stripline are increasingly popular transmission line media for short distance, low power applications, including RF microwave circuits and high speed digital circuits. Stripline consists of a printed conductor between two ground planes, typically formed from copper-clad polyethylene sheets. Electrically, stripline has properties similar to coaxial cable transmission lines.

Microstrip, a popular transmission line due to ease of fabrication and circuit assembly, uses dielectric substrates with a metal either deposited on or etched away to form the circuit line conductors. Microstrip has a single ground plane with a dielectric layer sandwiched between the circuit conductors and the ground plane. Generally, the attenuation characteristics of microstrip are greater than that of stripline, and also the power handling capability of microstrip is lower. Stripline provides inherently better crosstalk (i.e., neighboring channel interference) performance because the field within a stripline conductor is totally contained between the two ground planes. Although crosstalk interference is greater with microstrip, the exposed microstrip conductors are convenient for attaching circuit elements, and thus microstrip is typically used for applications requiring the attachment of circuit elements to the board. However, to reduce crosstalk in a microstrip embodiment, thin signal traces and a thin microstrip board are used.

In the prior art, microstrip is used to provide RF signals to transducers of an acousto-optic Bragg cell. In some applications, the Bragg cell may have 64, 128, or more, transducers each to receive a different RF signal. Because the microstrip conductors are exposed, it is relatively easy to attach the Bragg cell transducers thereto, but crosstalk performance is less than optimum because the microstrip has a conductive ground plane on only one surface. Microstrip can also be used to interface VHSIC (Very High-Speed Integrated Circuit) elements and to connect VHSIC elements to other devices. Because microstrip is a form of transmission line, it provides the necessary high-speed performance for VHSIC configured devices or any high-speed circuits.

Because stripline offers improved crosstalk performance characteristics over microstrip, it is desirable to use stripline in lieu of microstrip whenever possible. Since the stripline conductor is sandwiched between the two ground planes, access thereto creates difficulties. One technique for resolving these disadvantages is disclosed in U.S. Pat. No. 3,209,291. In this invention the circuit element is built directly into the center conductor of the balanced stripline transmission line by cutting a hole in the center conductor and placing the element within the hole. U.S. Pat. No. 4,085,390 discloses assembling the discrete components on the center conductor and cutting away a pocket in the dielectric to provide clearance for these circuit components. Lastly, U.S. Pat. No. 3,792,383 discloses a hybrid stripline using discrete and distributed circuit components. The discrete components are fixed to one ground plane with the leads protruding through openings in the ground plane and the attached dielectric. The leads are soldered to the circuit between the ground planes by using an access opening in the ground plane on the opposite side of the circuit board from where the discrete component is mounted. This access opening is sufficiently large to receive a soldering tip for soldering the component lead to the stripline circuit.

In another stripline embodiment access holes can be provided to the inner conductor by plated-through holes from one of the ground planes. A disadvantage associated with this technique is that the two boards comprising the stripline board are ideally extremely thin (to reduce crosstalk) and the copper conductor thickness is also reduced, thus the plated-through holes have a very brittle contact with the inner lines. It is therefore easy for this contact to be broken by board flexing associated with normal use.

It is well-known in the art that a standard printed circuit board can accommodate leads spaced at approximately 10 mils but such printed circuit boards do not provide acceptable high-frequency performance. At high frequencies the circuit traces act as distributed circuit elements, creating impedance problems, and the close spacing degrades the crosstalk performance.

SUMMARY OF THE INVENTION

In essence, the problem is to develop a technique for interfacing a plurality of RF signals to a circuit element having closely-spaced leads (for example, 64 RF signal lines for an acousto-optic Bragg cell). As discussed above, this has been accomplished in the prior art by using microstrip (because microstrip conductors are exposed). The present invention accomplishes the same result using stripline, which offers improved operating characteristics over microstrip. For example, stripline has a lower impedance, which ensures lower losses and a wider bandwidth than available with microstrip or conventional printed circuit boards. The physical contact between the circuit element and the ground plane allows heat to be conducted away from the circuit element by the ground plane.

It is an objective of the present invention to provide a stripline interconnection apparatus (and a method for making the apparatus) for connecting a circuit element having closely spaced leads to other devices. This invention solves the problem of accessing the buried signal line of the stripline conductor so that the circuit element can be attached to one end of the signal line, and a connector for attaching this circuit element to other devices can be connected at the other end of the signal line. The signal lines are closely-spaced at the circuit element attach point and spaced farther apart at the connector end.

The stripline access for attaching the circuit element is obtained by cutting a different-sized rectangular hole in each of the two conductive ground planes before these ground planes are laminated together. These rectangular holes, which are cut near the center of the ground planes in one embodiment, reveal the ends of the stripline signal line for bonding the circuit element thereto. To access the signal lines at the periphery of the ground planes (i.e., outwardly away from the rectangular holes) additional access holes are cut in the top ground plane and dielectric before lamination. These additional access holes reveal conductive pads of the signal line, thus providing a connection point for an electrical connection to the leads of the circuit element. This technique eliminates the plated-through holes and the disadvantages associated therewith. The signal line circuit begins at the pad and runs to the rectangular hole where the other end of the signal line is exposed. Thus, the signal line is exposed only at the conductive pad, where a wire or connector can be attached, and at the rectangular hole in the ground plane, where the circuit element is attached. The exceptional crosstalk performance of the stripline is not significantly degraded by exposing these small portions of the signal line.

BRIEF DESCRIPTION OF THE DRAWINGS

The present invention may be better understood, and the further advantages and uses thereof more readily apparent, when considered in view of the following detailed description of exemplary embodiments, taken with the accompanying drawings in which.

DESCRIPTION OF THE PREFERRED EMBODIMENTS

Figure 1:
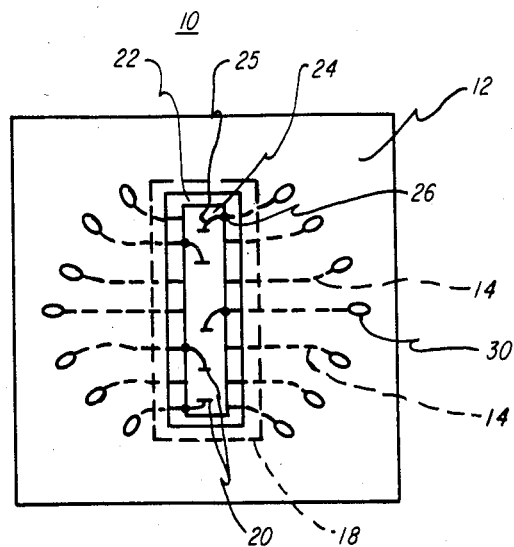
FIG. 1 is a top view of a first embodiment of a stripline interface conductor constructed according to the teachings of the present invention.
Figure 2:
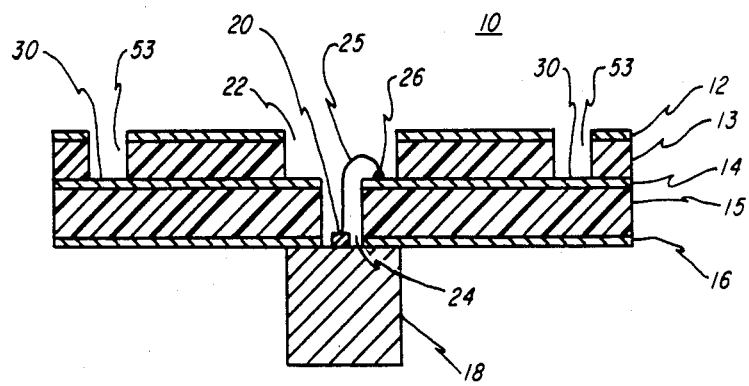
FIG. 2 is a side view of the stripline interface conductor of FIG. 1.

In a preferred embodiment, a stripline interface 10, illustrated in FIG. 1, interfaces multiple RF signals to transducers on a Bragg cell. As will be appreciated by those skilled in the art, the stripline interface 10 can be used for any application where a circuit device having closely-spaced leads must be interconnected in a high-speed environment to other circuit elements. Stripline is preferred over microstrip because the former reduces line impedance and electrical crosstalk. As illustrated in FIG. 2, the stripline interface 10 includes an upper ground plane conductor 12, a dielectric layer 13, a signal trace 14, a dielectric layer 15, and a lower ground plane conductor 16. The thickness of these various layers of the stripline interface 10 is exaggerated in FIG. 2 for clarity. A circuit element 18 is shown in FIG. 2, and also in FIG. 1 where dashed lines indicate that the circuit element 18 is obscured by the stripline interface 10. As will be discussed further below, the various layers illustrated in FIG. 2 are sculpted to provide access to the signal trace 14.

In one embodiment the circuit element 18 is a Bragg cell having a plurality of transducers located thereon. As is well known in the art, accoustic waves are launched into the Bragg cell by transducers bonded to the material and responsive to RF signals. Light incident on the Bragg cell can perform signal processing operations such as frequency channelization since the light exiting the cell carries the phase and amplitude information of the RF analog signals input thereto. Auxiliary lenses perform an optical Fourier transformation onto a detector array that senses the power spectrum of the RF signals. The transducers are shown generally by the reference character 20 in FIG. 1. A single transducer is also indicated by the reference character 20 in FIG. 2.

As discussed above, it is necessary to connect each transducer 20 to an RF signal. In the present invention this is accomplished by first cutting a single rectangular access opening 22 in the upper ground plane conductor 12 and the dielectric layer 13, thus exposing the signal trace 14. A smaller access opening 24 is cut in the lower ground plane conductor 16 the signal trace 14, and the dielectric layer 15 to provide access to the Bragg cell transducers 20. The access openings 22 and 24 are designated in FIG. 1 and can be seen in FIG. 2. When the circuit element 18 is attached to the lower ground plane conductor 16, the access openings 22 and 24 permit access to the transducers 20. Bond wires 25 are run between each transducer 20 and a bonding point 26. Since the access openings 22 and 24 are of different sizes, a portion of the stripline signal trace 14 is revealed. Each junction 26 is the termination point for a signal trace in the signal trace 14. The signal traces 14 are shown in FIG. 1 by dashed lines to represent that they are obscured by the upper ground plane conductor 12. The other end of each signal trace 14 terminates in a pad, designated by reference character 30. The pad is formed in the signal trace 14 and is revealed by cutting a hole 53 in the upper ground plane conductor 12 and the dielectric layer 13. The hole is clearly visible in FIG. 2. Coaxial cable connectors, other connective devices, or other circuit elements can be attached to the pads 30 to provide a signal to or carry a signal away from each transducer 20. It is desirable to place the access openings 22 and 24 at a distance from the pads 30 that is dependent on the spacing of the leads of the circuit element. Thus the signal traces 14 form a spoke-like pattern around the circuit element such, that there is sufficient distance between each pad 30 for easily connecting a connective device.

As can be seen, this invention allows the use of stripline where heretofore only microstrip could be used, to provide interconnections to closely spaced transducers on a Bragg cell or other circuit devices having closely-spaced terminals. In another embodiment, the circuit element 18 represents a VHSIC (Very High-Speed Integrated Circuit) chip also having closely spaced leads. Stripline provides improved high-frequency performance over the well-known printed wiring board techniques for incorporating a VHSIC chip into a functional circuit. Stripline is also advantageous over microstrip because it offers lower line impedance, wider bandwidth, and better crosstalk performance.

Figure 3:
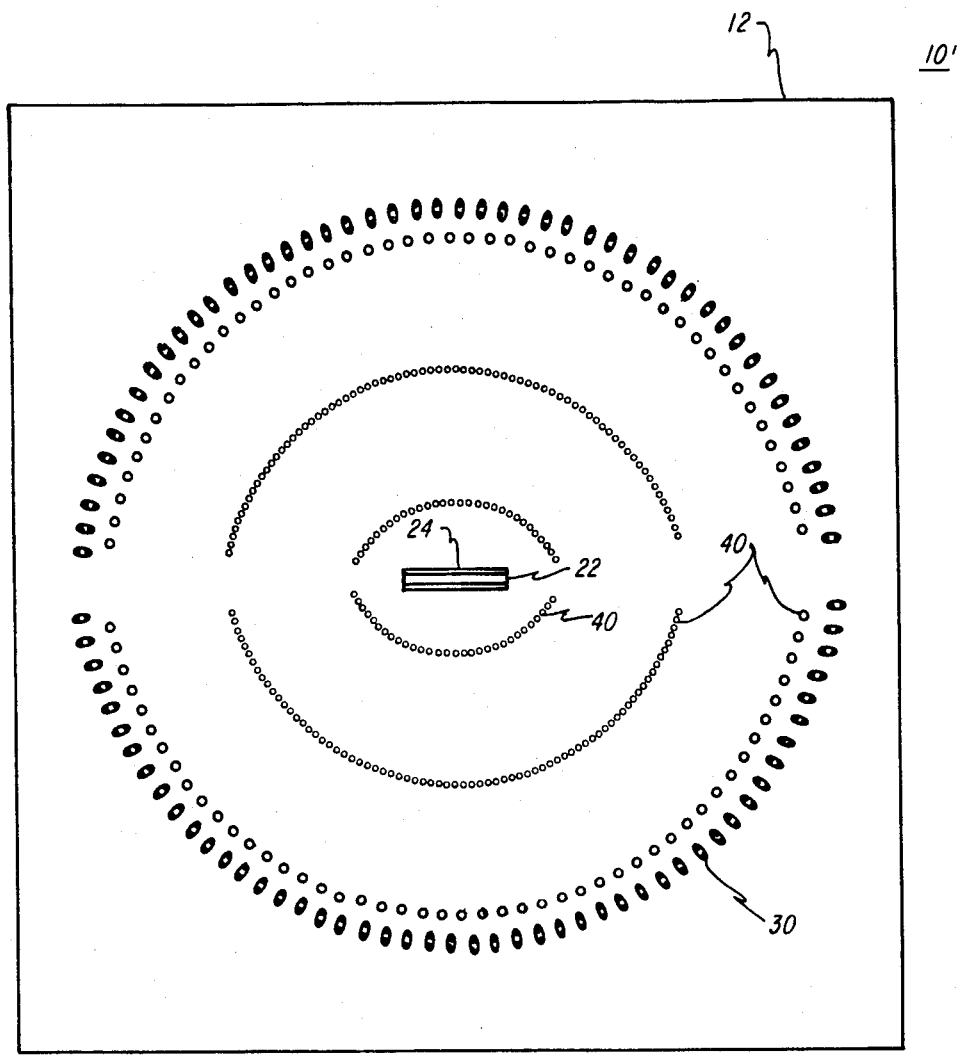
FIG. 3 is a top view of the upper ground plane of a second embodiment of the present invention.
Figure 4A:
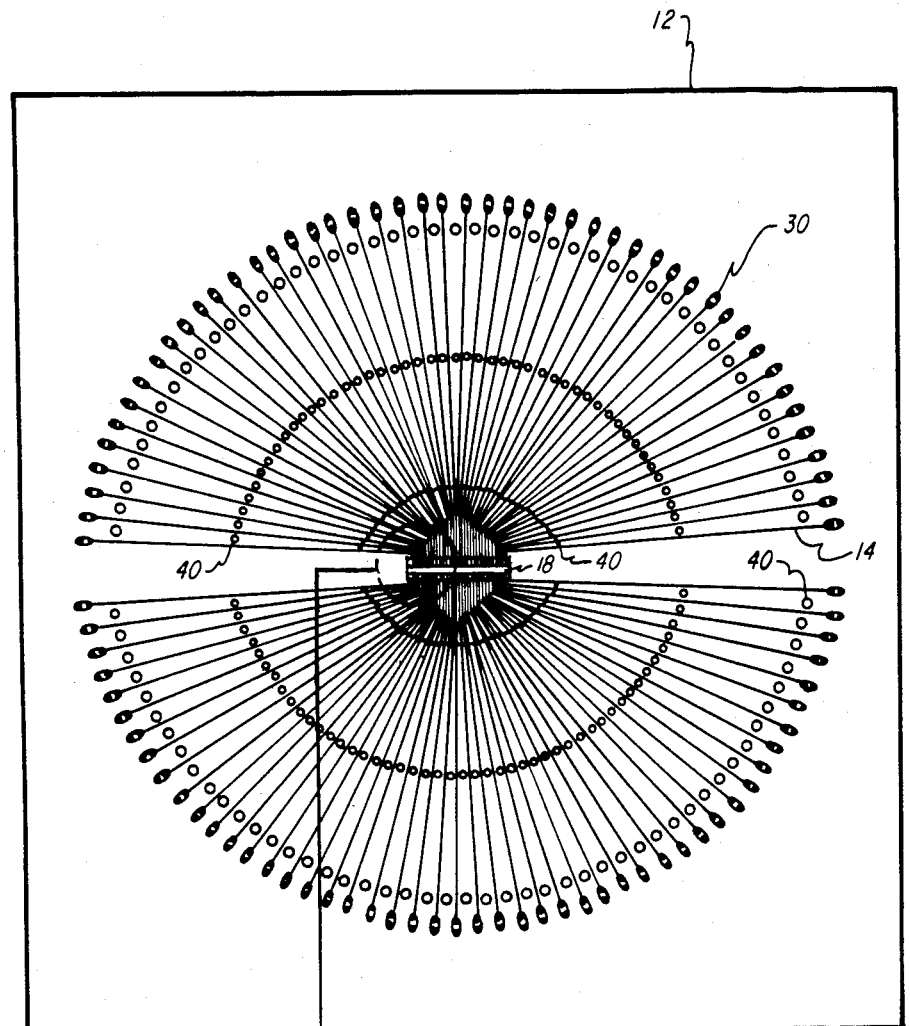
FIGS. 4A and 4B show a top view of the signal line conductors that are hidden beneath the upper ground plane of FIG. 3.
Figure 4B:
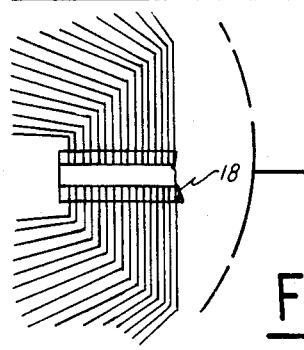

FIGS. 3, 4A and 4B illustrate a second embodiment of the stripline interface 10; in FIG. 3 the stripline interface is designated by reference character 10'. The elements of FIGS. 3, 4A and 4B are identical in structure and function to the elements bearing identical reference characters in FIGS. 1 and 2. FIG. 3 illustrates the stripline interface 10' including the upper ground plane conductor 12 and the pads 30. The pads 30 are formed in the signal traces 14 and are visible through holes cut in the upper ground plane 12. The access opening 22 is also cut in the upper ground plane 12. Also visible is a smaller access opening 24, which is cut in the lower ground plane 16; the lower ground plane 16 is not visible in FIG. 3. The stripline interface 10' also includes a plurality of holes designated generally by reference character 40. These holes pass though the upper ground plane conductor 12, the dielectric layers 13 and 15, the signal trace 14, and the lower ground plane conductor 16. After the stripline interface 10' is laminated together (as will be discussed hereinafter) wires are laced through the holes 40 to connect the upper and lower ground planes 12 and 16, respectively, providing a single ground.

FIGS. 4A and 4B illustrate the signal line layer 14 and the signal traces 14 thereon for the embodiment of FIG. 3. The signal traces 14 begin at the point where the rectangular holes 22 and 24 are cut in the upper and lower ground planes 12 and 16, respectively, and each signal trace 14 terminates at a pad 30. As can be appreciated from a study of FIG. 4A, the closely spaced conductors of a circuit element, such as a Bragg cell, can be connected to other devices through the spoke-like signal traces 14 radiating from the center of the stripline interface 10'. The holes 40, which are also illustrated in FIG. 4A, pass between signal traces 14 so as not to interfere with the continuity of these conductive paths.

FIGS. 3 and 4A illustrate an embodiment of the present invention where the stripline interface 10' accommodates a single circuit element having closely-spaced leads. Those skilled in the art will recognize that the advantages offered by this invention are easily extendable to an embodiment where a plurality of circuit elements having closely-spaced leads are mounted on a single stripline conductor, so long as there is sufficient distance between the closely-spaced leads and the pads 30 such that enough room is available for connecting a connector or other circuit element to the pads 30.

Construction of the stripline interface 10 according to the teachings of the present invention is best illustrated with reference to the exploded view in FIG. 5. As is well-known by those skilled in the art, the upper ground plane 12 and the dielectric layer 13 are commercially available as a single piece designated by the reference character 56. First the upper ground plane conductor 12, the dielectric layer 13, and a prepregnated bond film 52 (available from Minnesota Mining and Manufacturing; 3M Center; St. Paul, MN 55144) are perforated to make holes 53 for exposing the pads 30 (see FIG. 3). Also at this time, the rectangular access opening 22 is formed. A piece 58 comprises the dielectric layer 15 having a copper clad face in which the signal traces 14 are etched, and the lower ground plane 16. A rectangular hole such as the rectangular hole 24, is cut in the lower ground plane conductor 16, the dielectric layer 15, and the signal trace 14. Next the holes 40 (See FIG. 3) are cut rn the upper ground plane conductor 12, the dielectric layers 13 and 15, the prepregnated bond film 52, and the lower ground plane 16. The holes 40 are not visible in FIG. 5 because the FIG. 5 cross-section is formed by a plane cutting through the signal traces 14.

In one embodiment the signal traces 14 are five mil wide, and the signal traces 14 are one mil thick. A special etching technique, as described below, is necessary to produce lines of this dimension. A selective gold deposition process is required to manufacture the stripline interface 10 to provide a stripline circuit having closely spaced conductors. Conventional 1 oz. copper-clad circuit board is chemically reduced to 0.5 to 0.75 oz. After thorough, cleaning, photoresist is applied to expose the conductor pattern, i.e., the signal traces 14. The photoresist is removed leaving the thin copper layer 0.007–1.0 mil with the gold conductors. The gold conductors act as a resist material to etch the thin copper layer. A 20% ferric chloride is the etchant solution. A brushing technique is used to uniformally etch the thin copper layer. This technique eliminates undercutting of the conductor lines that is associated with the conventional printed wiring board etching. The well-defined signal traces 14 ensure lower losses and reduce line impedance and electrical crosstalk. The six layers illustrated in FIG. 5 are then pinned together and alignment is checked using X-ray alignment techniques. The pinned assembly is X-rayed from an axis normal to the plane of the stripline interface 10. The holes 40 are the alignment key as they are located between the signal traces 14. Pressure and heat are then applied so that the prepregnated bond film 52 laminates the elements of the stripline interface 10 together. This is accomplished by drawing a 14.5 psi vacuum and holding the temperature at 260° F. The unit is then cooled and the vacuum i released.

The ground planes 12 and 16 are connected together by lacing wires 70 through the holes 40. See FIG. 6. The stripline interface 10 is then ready for application of the circuit element 18 and connection of the bond wires 25 to the signal traces 14. A wire 60 is connected between a signal trace 28 and a connector or another circuit element (not shown in FIG. 5), thus completing the stripline interface between the circuit element having closely spaced terminals and another circuit element.

Figure 5:
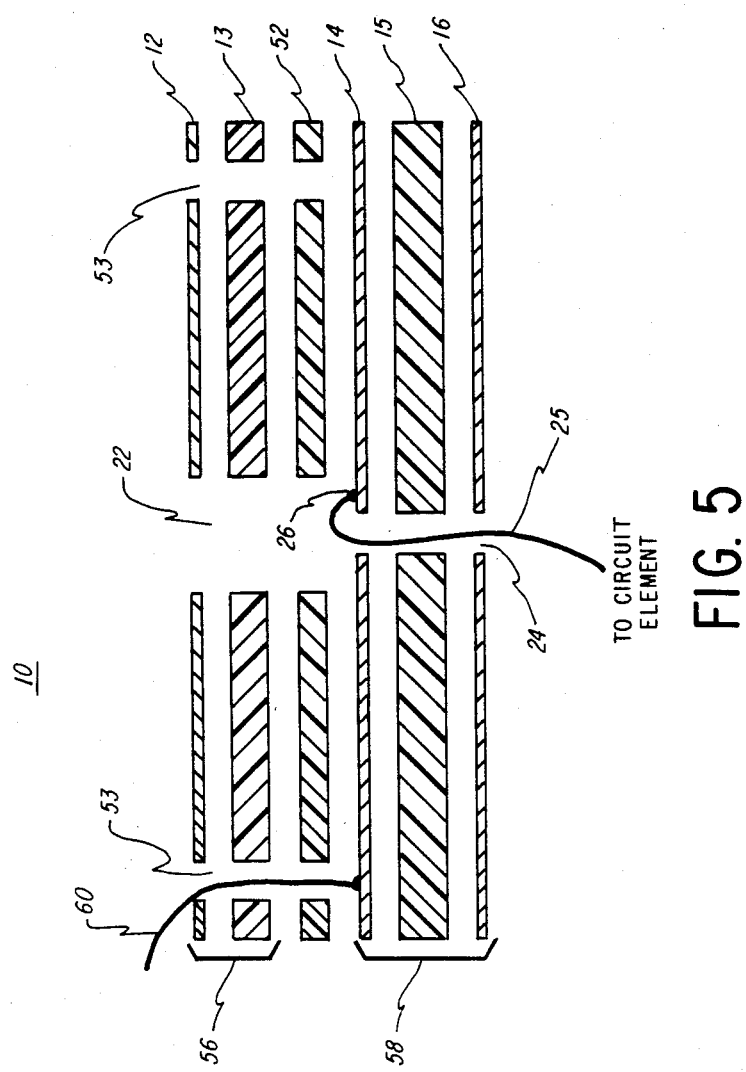
FIG. 5 depicts a method for constructing a stripline interface conductor according to the present invention.
Figure 6:
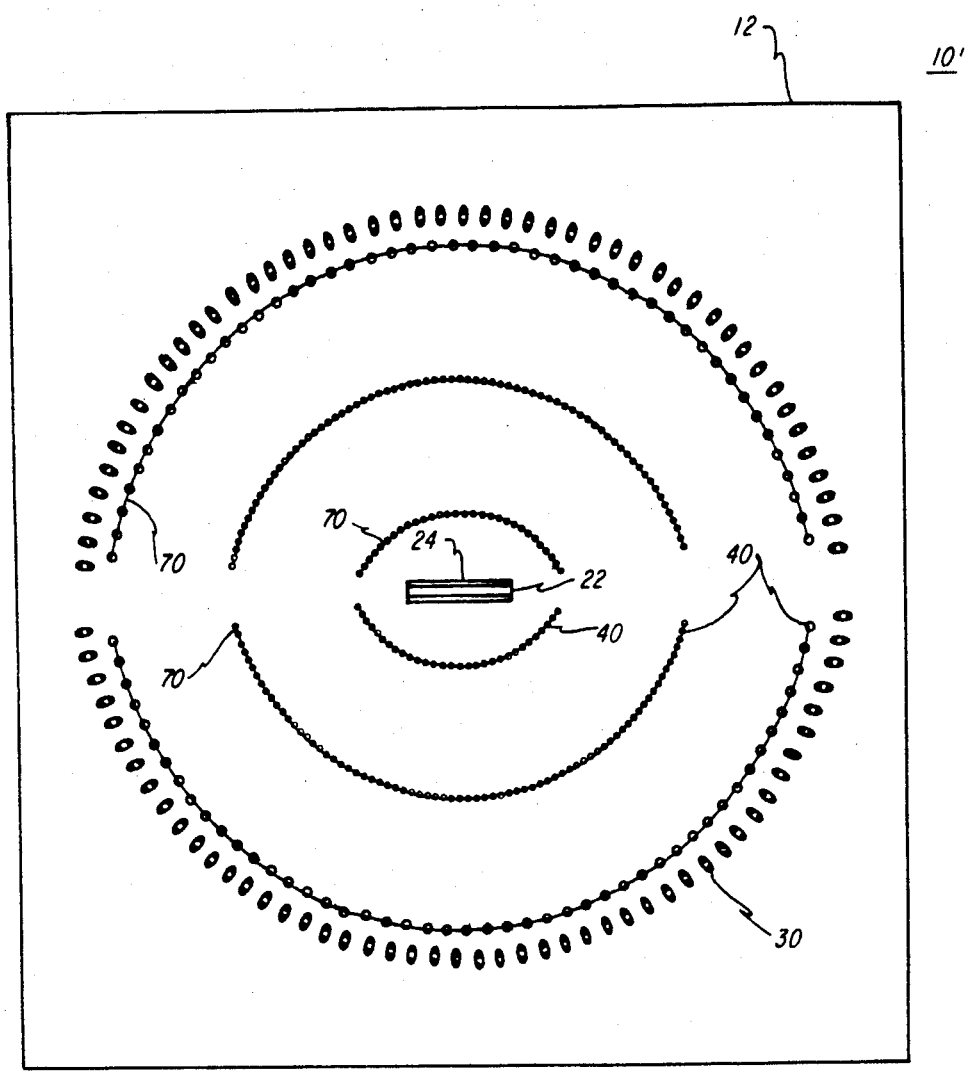
FIG. 6 is a top view of another embodiment of a stripline interface conductor constructed according to the teachings of the present invention.

To minimize crosstalk, in one embodiment the layers illustrated in FIG. 5 have the following approximate thickness:

The upper ground plane 12—1 mil
The dielectric layer 13—4 mils
The prepregnated bond film layer 52—3 mils
The signal traces 14—1 mil
The dielectric layer 15—5 mils
The lower ground plane conductor 16—1 mil While we have shown and described several embodiments in accordance with the present invention, it is understood that the same is not limited thereto but is susceptible of numerous changes and modifications as known to a person skilled in the art, and we therefore do not wish to be limited to the details shown and described herein, but intend to cover all such changes and modifications as are obvious to one of ordinary skill in the art.

What is claimed is:

1. A stripline interface conductor adapted for receiving a circuit element and for providing spaced apart connections to each lead of the circuit element, said stripline interface conductor comprising:

a first ground plane layer having a first access opening and a plurality of second access openings therein, wherein said plurality of second access openings are spaced at a predetermined distance from said first access opening;

a signal line layer adjacent said first ground plane layer and having a plurality of signal traces thereon, and having an access opening therein, wherein said access opening of said signal line layer is in registry with and smaller than said first access opening of said first ground plane layer, and wherein at first portion of at least one of said plurality of signal traces is exposed through said first access opening of said first ground plane layer, and a second portion of at least one of said plurality of signal traces is accessible through one of said plurality of second access openings, and wherein said circuit traces are closely spaced near said first access opening and spaced farther apart near said plurality of second access openings;

a second ground plane layer adjacent said signal line layer and having an access opening therein, wherein said access opening of sid second ground plane layer is of the same size and in registry with said access opening of signal line layer, and wherein leads of the circuit element are adapted to protrude through said access opening of said line layer and said access opening of said second ground plane layer of connection to said first portion of said plurality of signal traces;

and wherein spaced-apart connections are provided to said signal traces throgh said plurality of second access openings.

2. The stripline interface conductor of claim 1 wherein the first ground plane layer comprises a one-mil planar conductive layer and a four mil planar dielectric layer adjacent thereto.

3. The stripline interface connector of claim 1 wherein the signal line layer is one mil thick.

4. The stripline interface connector of claim 1 wherein the second ground plane layer comprises a one-mil planar conductive layer and a five-mil planar dielectric layer adjacent thereto.

5. The stripline interface of claim 1 including means for connecting the first and the second ground plane layers together.

6. The stripline interface conductor of claim 5 wherein the means for connecting the first and the second ground plane layers includes holes formed through the stripline interface conductor, and wherein a conductor laced through said holes connects the first and the second ground plane layers together.

7. The stripline interface conductor of claim 1 wherein the plurality of second access openings are spaced in a spoke-like pattern at a predetermined distance from the first access opening.

8. A process for forming a stripline interface conductor wherein said stripline interface conductor receives a circuit element and provides spaced apart connections to each lead of the circuit element, said process comprising the steps of:

forming a first ground plane layer having a first acess opening and a plurality of secodn access openings therein wherein said plurality of second access openings are spaced at a predetermined distance from said first access opening;

forming a signal line layer adjacent said first ground plane layer and a having a plurality of signal traces thereon, and having an access opening therein, wherein said access opening of said signal line layer is in registry with and smaller than said first access opening of said first ground plane layer, and wherein a first portion of at least one of said plurality of signal traces is exposed through said first access opening of said first ground plane layer, and a second portion of at least one of said plurality of signal traces is accesible through one of said plurality of second access openings, and wherein said circuit traces are closely spaced near said first access opening and spaced farther apart near said first plurality of second access openings;

forming a second ground plane layer adjacent said signal line layer and having an access opening therein, wherein said access opening of said second ground plane layer is of the same size and in registry with said access opening of said signal line layer, and wherein leads of the circuit element protrude through said access opening of said signal line layer and said access opening of said second ground plane layer for connection to said first portion of said plurality of signal traces;

and wherein spaced-apart connections are provided to said signal traces through said plurality of second access openings.

9. A process for forming a stripline interface conductor wherein said stripline interface conductor receives a circuit element and provides spaced apart connections to each lead of the circuit element, said process comprising the steps of:

perforating a first ground plane layer, a first dielectric layer, and a prepregnated layer to create a first access opening and a plurality of second access openings therein, wherein said plurality of second access openings are spaced at a predetermined distance from said first access opening;

in a second dielectric layer having a top and a bottom metallic surface, ethcing a plurality of signal traces in said top metallic layer;

forming an access opening in said second dielectric layer and said top and said bottom metallic surfaces thereof, wherein said access opening of said second dielectric layer is smaller than said first access opening of said first ground plane layer, said first dielectric layer, and said prepregnated layer;

placing said first ground plane layer, said first dielectric layer, and said prepregnated layer in contact with said second dielectric layer, wherin said first access opening is in registry with said access opening of said second dielectric layer, and wherein a first portion of at least one of said plurality of signal traces is exposed through said first access opening of said first ground plane layer, said first dielectric layer, and said prepregnated layer, and a second portion of at least one of said plurality of signal traces is accesible through one of said plurality of second access openings in said first ground plane layer, said dielectric layer, and said prepregnated layer, and wherein said circuit traces are closely spaced near said first access opening and are spaced farther part near said plurality of second access openings;

and wherein leads of the circuit element protrude through said access opening of said second dielectric layer for connection to said first portion of said plurality of signal traces;

and wherein spaced-apart connections are provided to said signal traces through said plurality of second access openings of said first ground plane layer, said first dielectirc layer, and said prepregnated layer.

* * * * *